United States Patent
Bu et al.

(10) Patent No.: US 7,217,626 B2
(45) Date of Patent: May 15, 2007

(54) TRANSISTOR FABRICATION METHODS USING DUAL SIDEWALL SPACERS

(75) Inventors: Haowen Bu, Plano, TX (US); PR Chidambaram, Richardson, TX (US); Rajesh Khamankar, Coppell, TX (US); Lindsey Hall, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 247 days.

(21) Appl. No.: 10/899,360

(22) Filed: Jul. 26, 2004

(65) Prior Publication Data

US 2006/0019456 A1    Jan. 26, 2006

(51) Int. Cl.
*H01L 21/336*    (2006.01)
(52) U.S. Cl. .................. 438/303; 438/184
(58) Field of Classification Search ............ 438/184, 438/301, 230–232, 303–306, 595; 257/E21.626, 257/E21.64, 900
See application file for complete search history.

(56) References Cited

U.S. PATENT DOCUMENTS

| | | | |
|---|---|---|---|
| 5,019,882 A | 5/1991 | Solomon et al. | |
| 5,241,197 A | 8/1993 | Murakami et al. | |
| 5,683,934 A | 11/1997 | Candelaria | |
| 5,863,827 A | 1/1999 | Joyner | |
| 5,882,981 A | 3/1999 | Rajgopal et al. | |
| 6,004,871 A | 12/1999 | Kittl et al. | |
| 6,087,241 A | 7/2000 | St. Amand et al. | |
| 6,211,064 B1 | 4/2001 | Lee | |
| 6,214,699 B1 | 4/2001 | Joyner | |
| 6,261,964 B1 | 7/2001 | Wu et al. | |
| 6,284,233 B1 | 9/2001 | Simon et al. | |
| 6,284,626 B1 | 9/2001 | Kim | |
| 6,284,633 B1 | 9/2001 | Nagabushnam et al. | |
| 6,406,973 B1 | 6/2002 | Lee | |
| 6,573,172 B1 | 6/2003 | En et al. | |
| 6,838,732 B2* | 1/2005 | Igarashi et al. ............. 257/344 |
| 6,949,436 B2* | 9/2005 | Buller et al. ................ 438/303 |
| 2002/0127763 A1* | 9/2002 | Arafa et al. .................. 438/76 |
| 2003/0111699 A1 | 6/2003 | Wasshuber et al. | |

OTHER PUBLICATIONS

U.S. Appl. No. 10/899,359, filed Jul. 26, 2004, Bu et al.

* cited by examiner

*Primary Examiner*—David Vu
(74) *Attorney, Agent, or Firm*—Peter K. McLarty; W. James Brady, III; Frederick J. Telecky, Jr.

(57) ABSTRACT

Methods (50) are presented for transistor fabrication, in which first and second sidewall spacers (120a, 120b) are formed laterally outward from a gate structure (114), after which a source/drain region (116) is implanted. The method (50) further comprises removing all or a portion of the second sidewall spacer (120b) after implanting the source/drain region (116), where the remaining sidewall spacer (120a) is narrower following the source/drain implant to improve source/drain contact resistance and PMD gap fill, and to facilitate inducing stress in the transistor channel.

21 Claims, 7 Drawing Sheets

TRANSISTOR FABRICATION METHODS USING DUAL SIDEWALL SPACERS

FIELD OF INVENTION

The present invention relates generally to semiconductor devices and methods for making the same.

BACKGROUND OF THE INVENTION

Current trends in the semiconductor industry include faster switching speeds, reduced power consumption, and lower operating voltages, wherein the performance of MOS transistors needs to be correspondingly improved. For example, high-speed transistors are required for modern wireless communications systems, portable computers, and other low-power, low-voltage devices, wherein MOS transistors must be adapted to operate at lower voltages using less power. Carrier mobility in a MOS transistor has a significant impact on power consumption and switching performance. The carrier mobility is a measure of the average speed of a carrier (e.g., holes or electrons) in a given semiconductor, given by the average drift velocity of the carrier per unit electric field. Improving the carrier mobility in the channel region of a MOS transistor can improve the switching speed, and can also facilitate operation at lower voltages, alone or in combination with reducing the transistor channel length and gate dielectric thickness to improve current drive and switching performance.

Carrier mobility of a MOS transistor is affected by the mechanical stress in the device channel. The carrier mobility can be improved by depositing silicon/germanium alloy or other material layers between upper and lower silicon layers under compressive stress, in order to enhance hole carrier mobility in a channel region. For NMOS transistors, tensile stress in the channel material improves carrier mobility by lifting conduction band degeneracy. However, buried silicon/germanium channel layer devices have shortcomings, including increased alloy scattering in the channel region that degrades electron mobility, a lack of favorable conduction band offset which mitigates the enhancement of electron mobility, and the need for large germanium concentrations to produce strain and thus enhanced mobility. Furthermore, such additional alloy layers and silicon layers are costly, adding further processing steps to the device manufacturing procedure.

Thus, there is a need for methods and apparatus by which the carrier mobility and other electrical operational properties of MOS transistor devices may be improved so as to facilitate improved switching speed and low-power, low-voltage operation, without significantly adding to the cost or complexity of the manufacturing process.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to methods for transistor fabrication, in which relatively wide sidewall spacers are provided along lateral sides of a transistor gate structure during deep source/drain implantation to control the location of the source/drains on either side of the transistor channel region, and the spacers are narrowed after the deep source/drain implant to facilitate inducing enhanced stress in the transistor channel, to improve source/drain contact resistance, and to improve PMD gap fill. The invention may be employed in conjunction with stress inducing PMD liner material layers formed over the transistor after source/drain implantation, wherein the reduced sidewall spacer width facilitates inducing enhanced stress at the center of the transistor channel.

In accordance with one aspect of the invention, a method is provided for fabricating a transistor. The method comprises forming a gate structure, forming a first sidewall spacer alongside the gate structure, and forming a second sidewall spacer alongside the first spacer. The method further comprises performing a deep source/drain implant after forming the second sidewall spacer, and removing at least a portion of the second sidewall spacer after the deep source/drain implant. The first and second sidewall spacers may be fabricated using different materials, wherein all or a portion of the second sidewall spacer can be etched after the deep source/drain implant using an etch process that is selective to the first sidewall spacer material. In one example, the first sidewall spacer comprises silicon nitride or silicon oxynitride having carbon, wherein the second sidewall spacer material is substantially free of carbon. In this example, the second spacer material can be selectively removed after the source/drain implant via a phosphoric acid etch without removing significant amounts of the first spacer and without damaging STI trench oxide.

The following description and annexed drawings set forth in detail certain illustrative aspects and implementations of the invention. These are indicative of but a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale.

The invention provides techniques for improving transistor performance by facilitating application of stress to improve carrier mobility, such as tensile stress provided to NMOS channel regions, and by source/drain contact resistance improvement. In one particular implementation illustrated and described hereinafter, a stress inducing PMD liner nitride film is formed over the transistor following silicide processing to impart stress in the transistors, where the liner protects the underlying transistors from a subsequently formed pre-metal dielectric (PMD) material and operates as an etch-stop layer in forming openings for contacts to transistor terminals through the PMD material. In accordance with the invention, a dual sidewall spacer technique is employed to provide wide spacers during deep source/drain implantation, with a narrower spacer during silicide processing and PMD liner formation, by which the contact resistance of the silicide source/drain contact can be reduced, PMD gap fill can be improved, and by which the PMD liner has a greater impact on the stress level at the center of the transistor channel.

The inventors have appreciated that it is desirable to increase carrier mobility throughout the length of the transistor channel, including the central portion of the channel, which may be accomplished by depositing certain stress inducing materials over the transistors. However, the inventors have found that the induced stress at any location in the semiconductor material varies with the distance between the stress inducing material and the semiconductor material. In the case where a PMD liner material is deposited over the transistor after silicide processing, the resulting stress at the central portion of the channel can be increased by reducing the distance from the PMD liner to the channel center. The invention provides techniques for reducing this distance, and hence increasing the stress effect at the channel center, by reducing the sidewall spacer width at the point where the PMD liner is formed during fabrication.

The improved induced stress, in turn, results in improved carrier mobility and hence improved transistor drive current. In one example, reducing the sidewall spacer width from 700 Å to 500 Å results in about 20–25% increase in carrier mobility, leading to about 5–10% higher drive current. However, the inventors have further appreciated that merely decreasing the sidewall spacer width throughout fabrication processing may lead to unacceptable transistor leakage current because the sidewall spacer width also serves to set the lateral location of the deep source/drain dopants during implantation. Thus, if the sidewall spacers are too narrow during deep source/drain implantation, the dopants may diffuse too far under the gate (e.g., toward the center of the channel) during subsequent processing, which may cause higher transistor leakage current.

Figure 1:
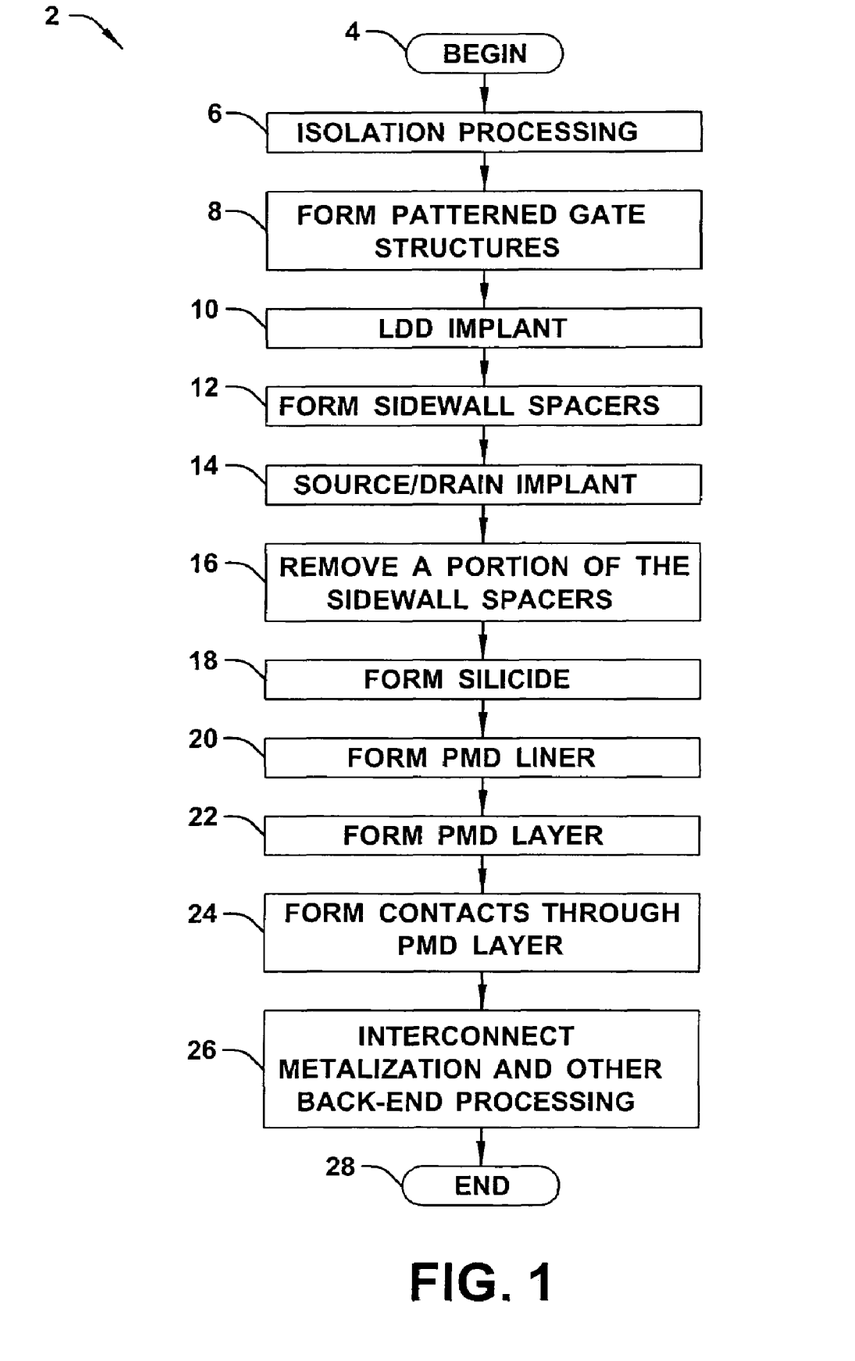
FIG. 1 is a simplified flow diagram illustrating an exemplary transistor fabrication method in accordance with the present invention.

Referring initially to FIG. 1, the invention accordingly provides fabrication methods in which initially wide sidewall spacers are provided during deep source/drain implantation, and narrower spacers are subsequently provided during formation of the stress inducing PMD liner, whereby improved transistor performance can be realized without adversely impacting leakage current. A method 2 is illustrated in FIG. 1 in accordance with the present invention. While the method 2 and other methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

Beginning at 4, isolation processing and well formation are performed at 6 in the method 2, wherein any suitable isolation processing may be performed at 6, such as local oxidation of silicon (LOCOS) processing to form field oxide (FOX) isolation structures, shallow trench isolation (STI) processing, or other suitable techniques to form isolation structures between active regions of a semiconductor body. Patterned gate structures are then formed at 8 over channel regions of the semiconductor body. The invention may be employed in fabricating transistors with any suitable gate structure, such as a thin gate dielectric (e.g., oxides such as $SiO_2$, or other dielectric material) formed over the semiconductor channel, with an overlying conductive gate (e.g., doped polysilicon, metal, or stacks or multi-layer gate contact structures), which are formed at 8 by any suitable means, such as deposition of the gate dielectric and gate contact layers, followed by etching to define the patterned gate structure. At 10, a drain extension implant is performed to initially dope a shallow portion of prospective source/drain regions on either side of the channel. Any suitable drain extension implant may be performed at 10, including but not limited to lightly-doped-drain (LDD) implants, moderately-doped-drain (MDD) implants, etc.

Sidewall spacers are formed at 12 along lateral sides of the patterned gate structures. As described further below with respect to FIGS. 2 and 3A–3O, dual sidewall spacers may be formed at 12. Deep source/drain implantation is performed at 14 to further define the source/drain regions, after which a portion of the sidewall spacers is removed at 16 to reduce the effective or net sidewall spacer width. Silicide is then formed at 18 over the source/drains and the gate contact, and a PMD liner is formed at 20 to impart stress in the transistor for carrier mobility improvement. A PMD dielectric material layer is then formed over the liner at 22 and conductive contacts are formed at 24 through select portions of the PMD layer to provide electrical connection to the transistor gate and source/drains. Interconnect metallization and other back end processing is then performed at 26 to complete the device, and the method 2 ends at 28.

Figure 2:
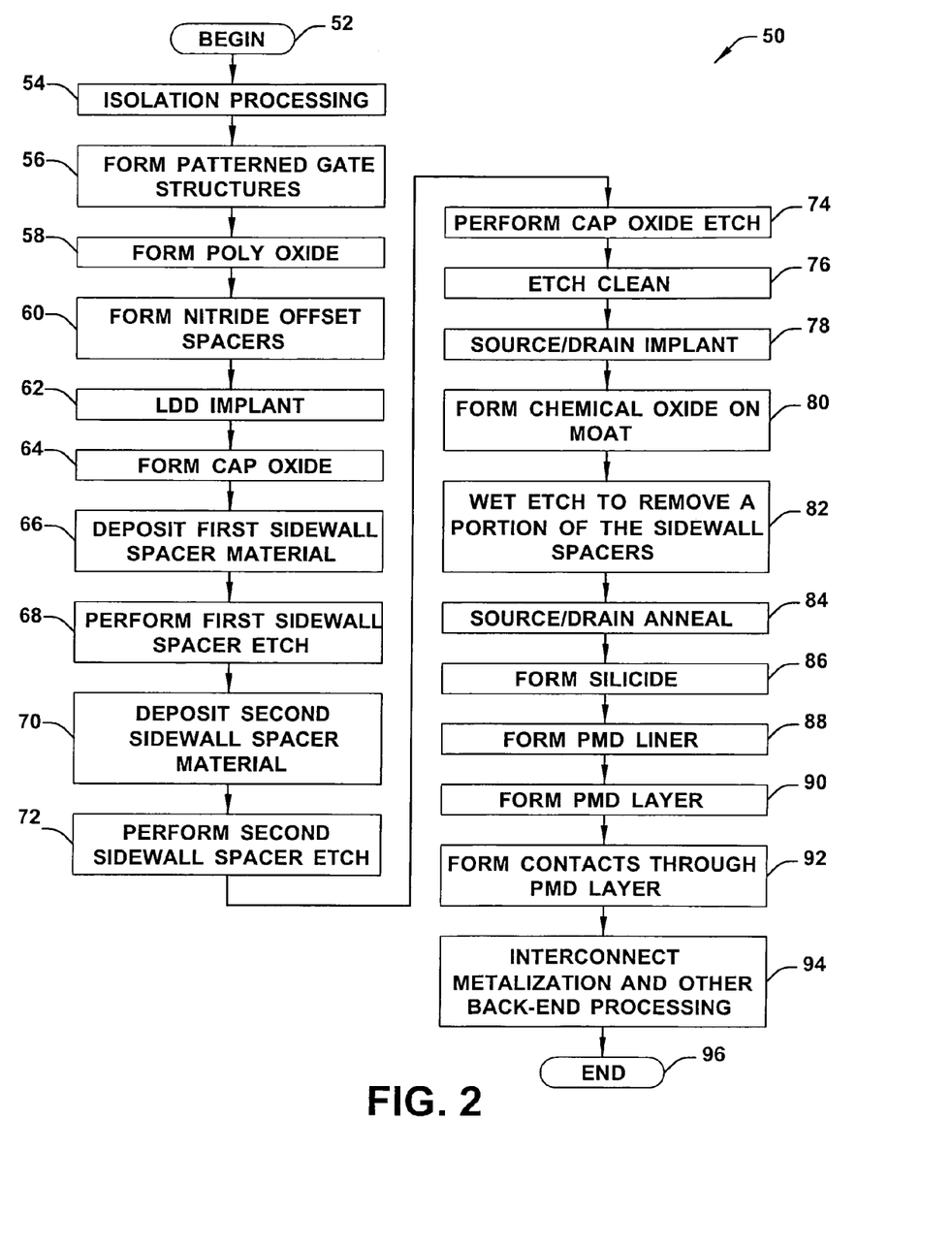
FIG. 2 is a detailed flow diagram illustrating an exemplary implementation of the invention using dual sidewall spacers.
Figure 3A:
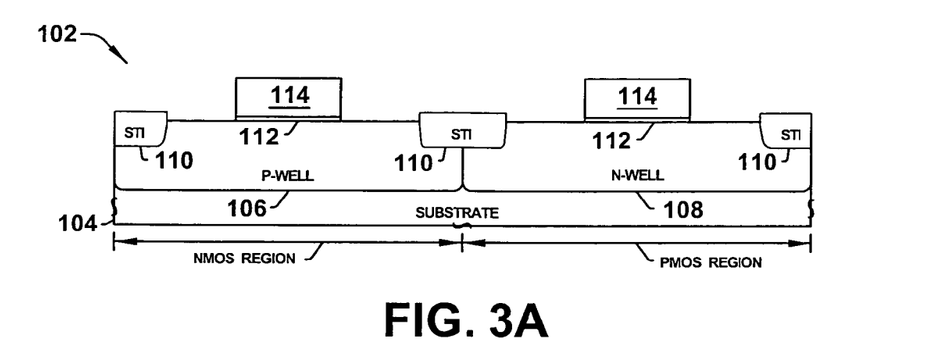
FIGS. 3A–3O are partial side elevation views in section illustrating an exemplary integrated circuit with MOS transistors undergoing fabrication processing generally in accordance with the method of FIG. 2.
Figure 3B:
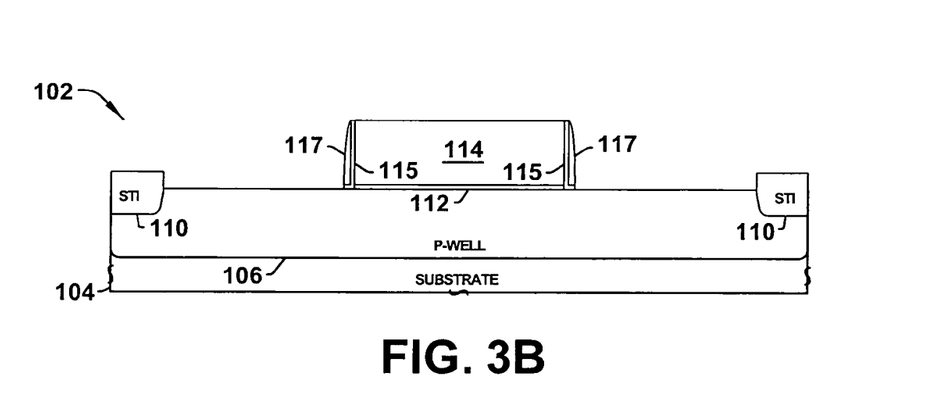
Figure 3C:
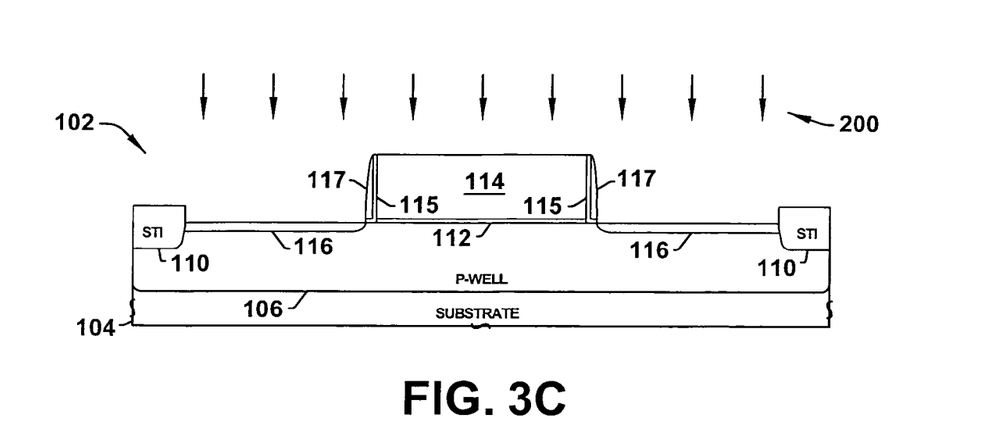
Figure 3D:
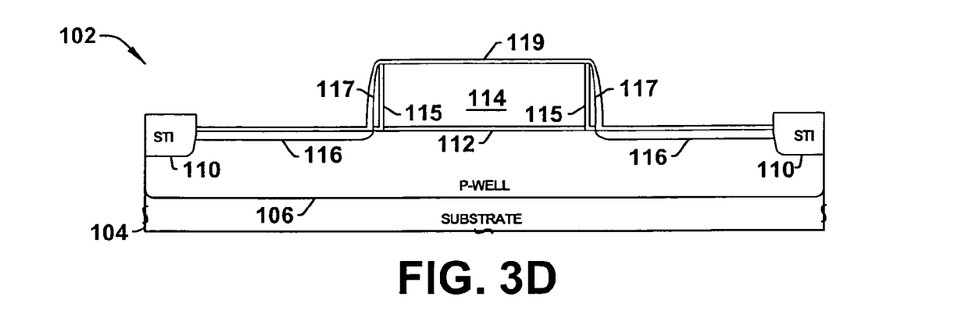
Figure 3E:
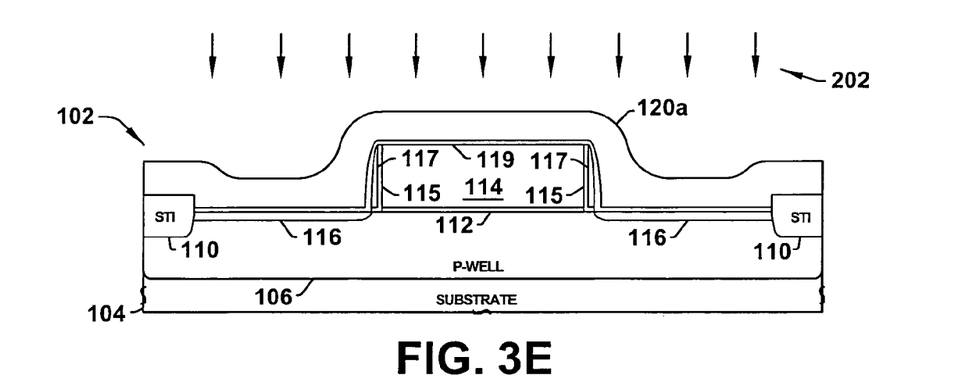
Figure 3F:
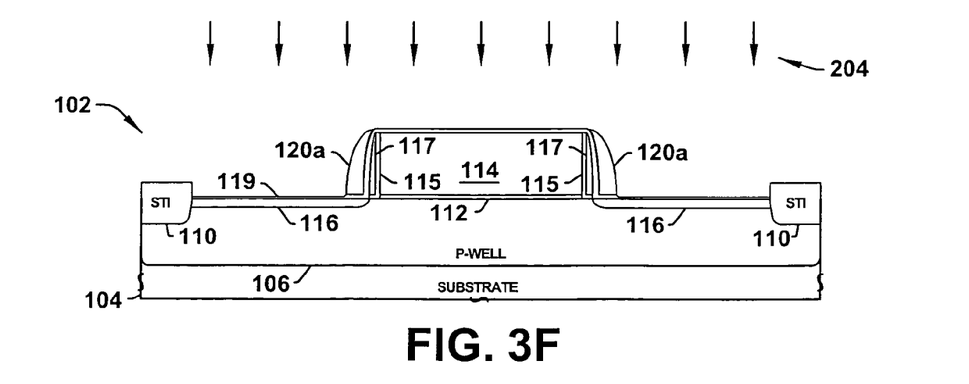
Figure 3G:
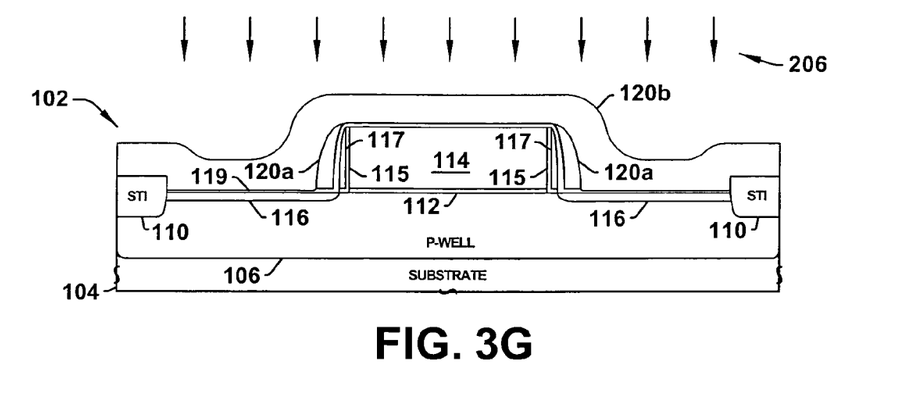
Figure 3H:
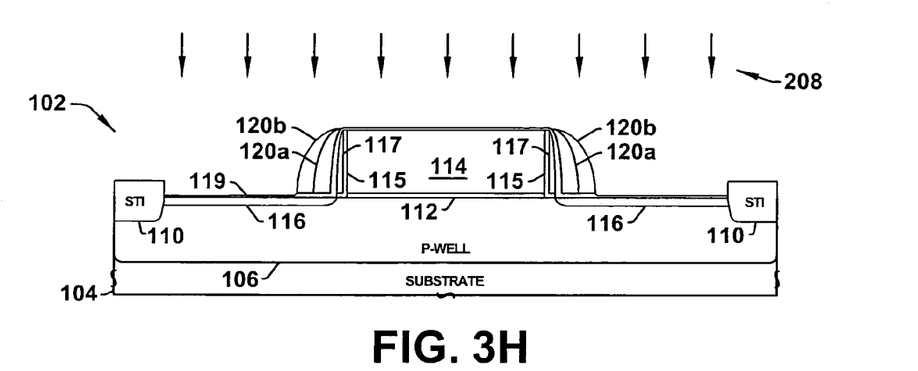
Figure 3I:
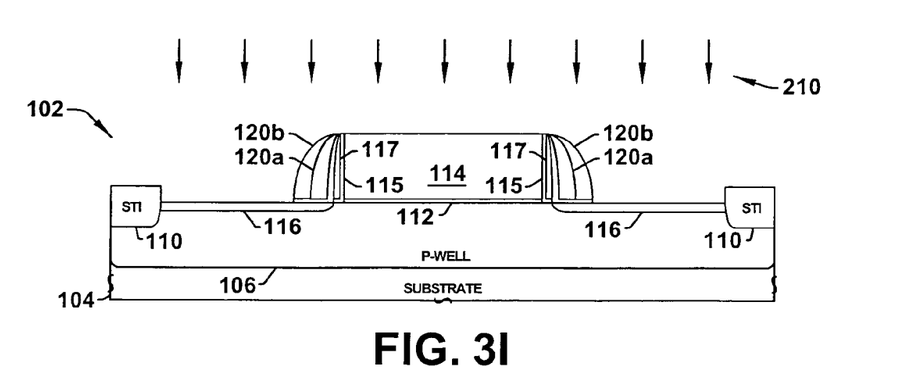
Figure 3J:
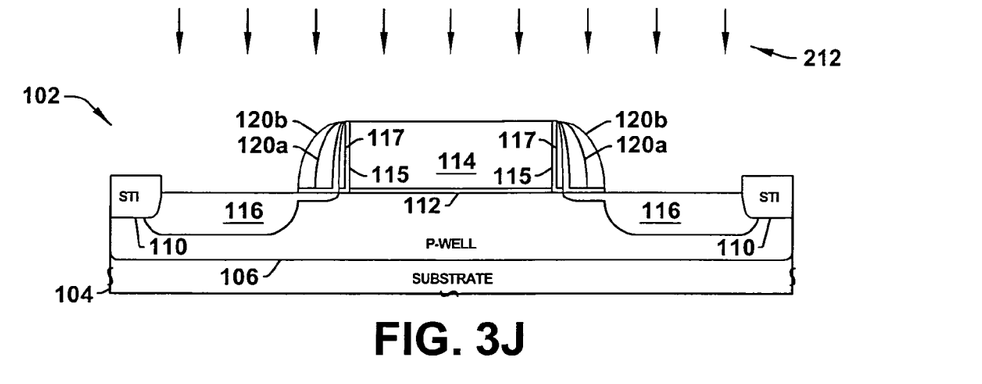
Figure 3K:
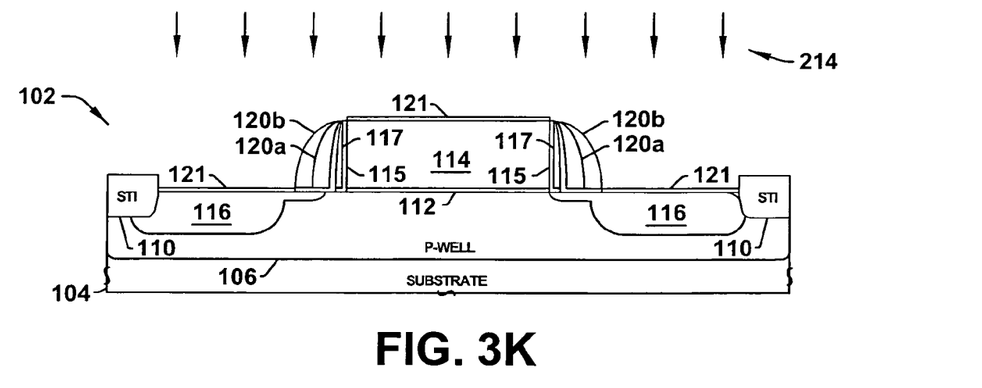
Figure 3L:
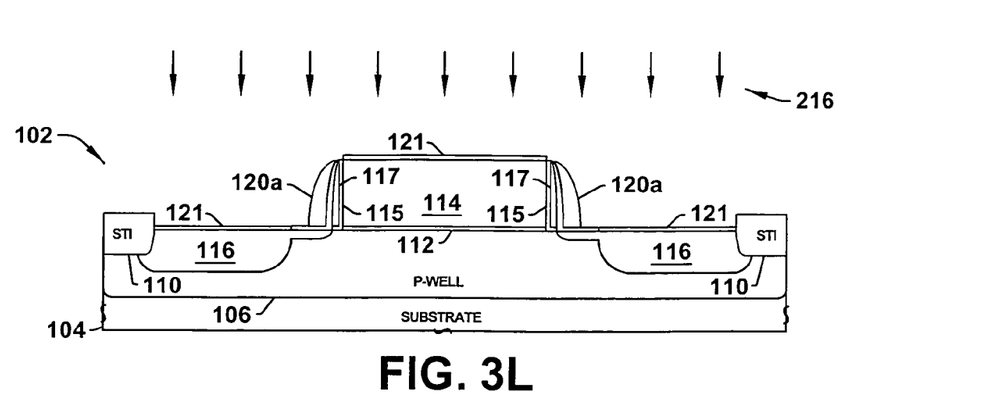
Figure 3M:
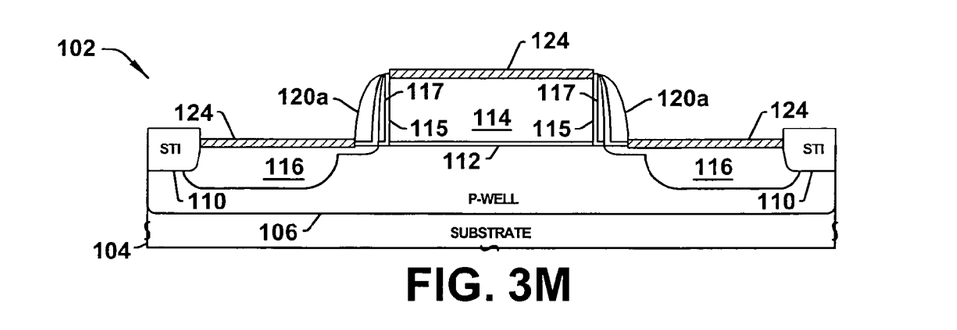
Figure 3N:
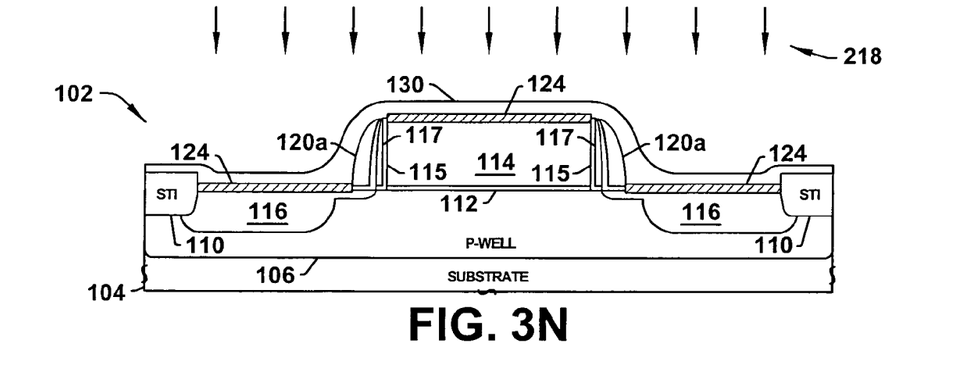
Figure 3O:
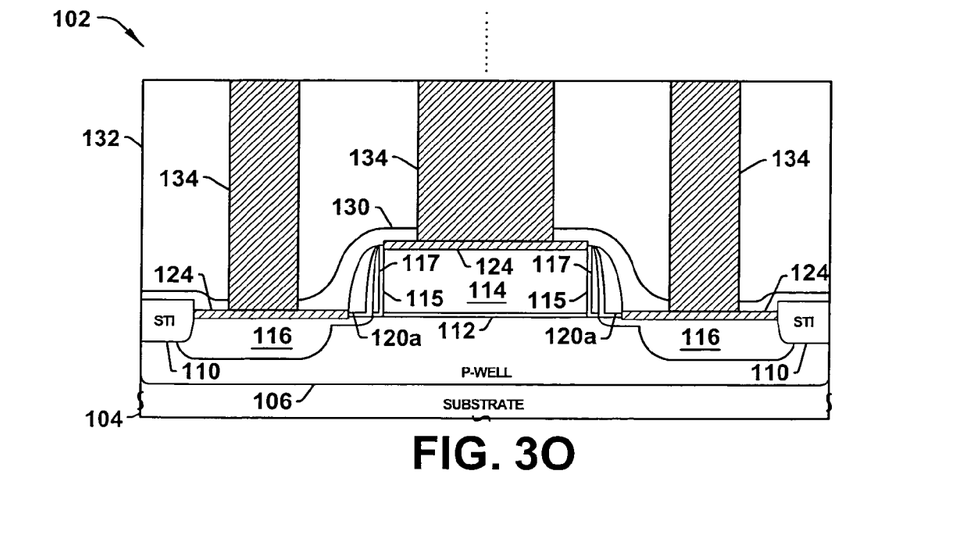

Referring now to FIGS. 2 and 3A–3O, FIG. 2 illustrates an exemplary detailed method 50 in accordance with the invention where dual sidewall spacers are employed to provide relatively wide spacers during source/drain implantation (e.g., to control the lateral location of the source/drains and hence transistor leakage current) and to provide narrower spacers thereafter during silicidation and PMD liner formation (e.g., to improve contact resistance, PMD gap fill, and carrier mobility). FIGS. 3A–3O illustrate an exemplary integrated circuit device 102 with MOS transistors undergoing fabrication processing generally in accordance with the method 50 of FIG. 2.

Beginning at 52 in FIG. 2, isolation processing and well formation are performed at 54. In FIG. 3A, the exemplary device 102 is illustrated following well formation and isolation processing beginning with a semiconductor body 104. The device 102 comprises includes NMOS and PMOS active regions of the semiconductor body 104, wherein a p-well 106 is formed in the NMOS region and an n-well 108 is formed in the PMOS region. STI isolation structures 110 are formed by etching trenches in isolation regions of the semiconductor body 104 and filling the trenches with oxide or other insulating material to separate the active regions and the devices thereof from one another and from other electrical components and circuits in the device 102, although LOCOS type field oxide isolation structures may alternatively be used.

At 56 in FIG. 2, patterned gate structures are formed over prospective channel regions of the semiconductor body 104. As illustrated in FIG. 3A, the exemplary gate structures in the NMOS and PMOS regions include a thin gate dielectric 112 (e.g., $SiO_2$, etc.) and a conductive gate contact 114 (e.g., doped polysilicon or other conductive material), wherein the gate dielectric 112 is situated between the conductive gate contact 114 and the prospective transistor channel regions. Any suitable gate structures may be employed within the scope of the invention, including but not limited to the illustrated gate dielectric and contact structures 112, and 114, respectively, or other suitable material layers or multilayers, including but not limited to metal gate layers. In the exemplary implementation, the gate dielectric material 112 is formed over the surface of the semiconductor body 104 by thermal oxidation and/or deposition, after which a layer of polysilicon 114 is deposited over the gate dielectric layer 112. The polysilicon 114 is then selectively etched using reactive ion etching or other suitable etch process with corresponding etch masking to define the patterned gate structures as shown in FIG. 3A in the NMOS and PMOS regions of the device 102.

The method 50 continues at 58 in FIG. 2, where a polysilicon oxide layer is formed through thermal oxidation or suitable deposition process (e.g., chemical vapor deposition (CVD)). Thereafter, thin nitride offset spacers are formed at 60. FIG. 3B illustrates the prospective NMOS region of the device 102 with thin poly oxide structures 115 formed along the sides of the patterned gate 112, 114, and nitride offset spacers 117 formed along the outer sides of the poly oxide 115. Although the remaining description below is provided in the context of fabricating an NMOS transistor, similar processing steps can be employed at suitable points in the process flow to construct PMOS transistors, with n-type regions being generally substituted for p-type regions and vice versa. A drain extension (e.g., LDD) implant is then performed at 62 in FIG. 2. As illustrated in FIG. 3C, a low energy, high dose LDD implantation process 200 is performed to provide n-type dopants into shallow portions of the exposed prospective source/drain regions 116 within the p-well 106. After the LDD implant at 62, the method 50 proceeds to 64 where a cap oxide 119 is formed over the device 102, as illustrated in FIG. 3D.

In accordance with the present invention, first and second sidewall spacers are then formed at 66–72 in FIG. 2. The first sidewall spacer is formed at 66 and 68, with a first sidewall spacer material 120a being formed over the gate structure 112, 114 and over the source/drain regions 116, as illustrated in FIG. 3E. Any suitable materials, thickness, and deposition techniques may be employed to form the first spacer material 120a at 66 within the scope of the invention. In the illustrated implementation, the first sidewall spacer material 120a is a BTBAS silicon nitride (e.g., $Si_WC_XN_Y$) or a BTBAS silicon oxynitride ($Si_WC_XN_YO_Z$) formed by a chemical vapor deposition (CVD) process 202 in FIG. 3E using a BTBAS (BisT-ButylAminoSilane) precursor, where the BTBAS material 120a includes carbon. As discussed below, the exemplary first sidewall spacer material 120a preferably comprises a different material than the subsequently formed second sidewall spacer material, such that the second material can be easily removed by selective etching following deep source/drain implantation (e.g., at 82 in FIG. 2 as discussed further below).

At 68, a first anisotropic etch process 204 is performed (FIG. 3F) to selectively remove the first sidewall spacer material 120a from over the gate 114 and an outer portion of the source/drain regions 116, leaving first sidewall spacers 120a situated along the lateral sides of the gate structure (e.g., outward of the poly oxide 115 and the nitride offset spacers 117 in this example). Any etch process 204 can be employed which operates to remove the first spacer material 120a in a generally anisotropic fashion.

A second (e.g., sacrificial) sidewall spacer is then formed at 70 and 72 in the method 50 of FIG. 2. As illustrated in FIG. 3G, a second sidewall spacer material 102b is formed via a deposition process 206 (e.g., at 70 in FIG. 2). Any suitable materials, thickness, and deposition techniques may be employed to form the second spacer material 120b at 70 within the scope of the invention. In the illustrated example, a CVD deposition process 208 is used to deposit silicon nitride or silicon oxynitride material 120b over the gate 114, over the first sidewall spacers 120a, and over the outer portion of the source/drain regions 116, where the exemplary second spacer material 120b has substantially no carbon. It is noted that using two different materials for the first and second spacers 120a and 120b facilitates selective removal of the second spacers 120b by selective etching as illustrated and described further below with respect to FIG. 3L.

As illustrated in FIG. 3I, a second anisotropic etch process 210 is performed (72 in FIG. 2) to selectively remove the second sidewall spacer material 120b from over the gate 114 and the source/drain regions 116, leaving the second sidewall spacers 120b having a width of about 100 Å or more along the outer lateral sides of the first sidewall spacers 120a. In the exemplary device 102, the combined spacers 120a, 120b provide a net spacer width of about 300–800 Å, where the second spacers 120b can be slightly more or less than half the effective or net width.

At 74 in FIG. 2, any remaining cap oxide (e.g., formed at 64 above) is removed via a wet or dry etch process 210, as illustrated in FIG. 3I, and an etch clean operation is performed at 76. Referring to 78, a deep source/drain implantation process 212 is performed to further dope the source/drain regions 116 with n-type dopants, as illustrated in FIG. 3J, where the lateral extent or location of the implanted deep source/drain dopants is largely determined by the net width of the first and second sidewall spacers 120a, 120b. The resist for source/drain patterning is then removed. If oxygen ash is used for resist removal, then a diluted HF may be used to remove the thin silicon oxide formed on the second spacer during the ash step. Then referring also to FIG. 3K, a thin chemical oxide 121 (e.g., about 10 Å) is formed at 80 using a process 214 to protect the source/drains 116 and the top of the gate 114 during subsequent etching. In this example, the chemical oxide 121 is formed by application of hydrogen peroxide with sulphuric acid that results in the formation of a very thin chemical oxide 121 on the upper surface of the source/drains 116 and the gate 114. The surface of the second spacer is substantially free of the chemical oxide formation.

Referring now to FIGS. 2 and 3L, as discussed above, while it is desirable to have wide spacers 120 to control the lateral location of the deep source/drain regions 116, it is also desirable to have narrower spacers 120 when siliciding the source/drains 116 and also when depositing a stress inducing material over the transistors. Accordingly, a wet etch process is performed at 82 (e.g., etch process 216 in FIG. 3L) to remove at least a portion of the second sidewall spacers 120b after the deep source/drain implant. In the exemplary device 102, the wet etch process 216 employs phosphoric acid at a temperature of about 160 degrees C in order to remove substantially all of the second sidewall spacer material 120b, wherein the wet etch process 216 reduces the lateral width of the second sidewall spacer 120b by about 100 Å or more.

Where the first and second spacer materials 120a and 120b are different (e.g., a first SiN or SiON 120a that includes carbon and a second SiN or SiON 120b that is substantially free of carbon), the exemplary phosphoric acid wet etch process is highly selective to the first spacers 120a (e.g., selectivity of greater than 10:1) and is also highly selective to the chemical oxide 121 and to the STI trench oxide 110 (e.g., selectivity of greater than 100:1), whereby substantially all of the second spacer material 120b is removed while only a small amount of the first spacer material 120a is removed (e.g., about 10 Å or less), without significant degradation of the STI trench oxide 110. At 84, a source/drain dopant activation anneal process is performed, by which the dopants in the source/drains 116 may diffuse further, wherein the source/drain activation anneal at 84 may optionally be performed prior to the wet etch at 82.

Referring now to FIG. 3M, silicide processing is performed (e.g., 86 in FIG. 2) to create conductive silicide structures 124 at the upper surfaces of the transistor gate 114 and the source/drains 116. Any suitable silicide materials 124 may be employed, such as nickel or cobalt silicide. In one example, a layer of nickel is deposited over the device 102 after removing all or a portion of the second sidewall spacers 120b, wherein the deposited nickel overlies the gate polysilicon 114 of the patterned gate structure and also overlies the doped source/drains 116 of the substrate 104. A thermal anneal is performed to react the nickel with the gate polysilicon 114 and with the source/drain substrate material 116, thereby forming a metal silicide 124 above the transistor terminals 114 and 116, as illustrated in FIG. 3M. It is noted at this point that the reduction of the sidewall spacer widths via the wet etch process allows source/drain silicide formation closer to the gate 114, whereby the source/drain silicide 124 will have improved (e.g., lower) contact resistance.

As a further benefit, the narrowed spacers 120 allow formation of a stress inducing material layer closer to the center of the channel region below the gate dielectric 112. As illustrated in FIG. 3N, a PECVD process 218 is performed to deposit a silicon nitride PMD liner 130 over the gate and the remaining first sidewall spacers 120a, wherein the liner 130 can be any material that provides a stress in the transistor. In the exemplary device 102, the silicon nitride PMD liner 130 has an as-deposited hydrogen content of about 20 atomic percent or more and provides an initial tensile stress of about 400–600 MPa in at least a portion of the NMOS region of the semiconductor body 104. Any suitable nitride deposition process 218 may be used, wherein the exemplary PECVD process 218 is performed at about 350 degrees C. or less, with a deposition chamber pressure of about 3.5 Torr or more, a silane ($SiH_4$) gas flow of about 150 sccm or less, and an ammonia ($NH_3$) gas flow of about 2500–3000 sccm, using high frequency RF power of about 50 W at 13.56 MHz, and low frequency power of about 10–20 W at 350 KHz.

The exemplary liner film 130 is meta-stable with a relatively high hydrogen content and operates to impart a moderate tensile stress in all or a portion of the NMOS region of the substrate 104 after the deposition process 218, such that subsequent application of thermal energy during subsequent back-end processing causes a reduction in the hydrogen content and an increase in the applied tensile stress in the NMOS region (e.g., to about 1 GPa or more in at least a portion of the NMOS region). Moreover, the PMD liner 130 may be formed to any suitable thickness within the scope of the invention, such as about 300 Å or more, about 500 Å in one example, where the liner 130 also operates as an etch stop layer in the creation of contact openings in a subsequently formed PMD dielectric material, wherein the thickness of the layer 130 may be selected according to the etch stop performance as well as according to the induced stress considerations.

In FIG. 3O, an initial dielectric (PMD) layer 132 is then deposited (e.g., at 90 in FIG. 2) over the nitride liner 130, where any suitable PMD materials and thicknesses may be employed. In one example, the PMD layer 132 comprises a phosphorous doped silicon oxide, deposited to a thickness of about 9000 Å over the stress inducing PMD liner 130, where the PMD layer 132 provides insulation between overlying and underlying conductive features, such as between the silicide contacts 124 and later-formed conductive interconnect features in subsequent metalization layers of the device 102 (not shown). The deposition of the PMD layer 132 and subsequent back-end processing steps provide thermal processing of the PMD liner nitride 130, causing the as-deposited meta-stable nitride material layer 130 to further stabilize and thereby to increase the tensile stress provided in the semiconductor body 104, wherein the proximity of the liner 130 to the transistor channel and the resulting stress related mobility improvements are enhanced by the selective removal of all or a portion of the second spacers 120b above. Conductive contacts 134 are then formed at 92 through the PMD layer 132 to connect with the silicide 124, after which a multilayer or multi-level interconnect routing (e.g., metalization) structure (not shown) is then formed above the PMD layer 132, and other back-end processing is performed at 94 before the method 50 ends at 96.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a transistor, the method comprising:
    forming a gate structure over a channel region of a semiconductor body;
    forming a first sidewall spacer along a lateral side of the gate structure;
    forming a second sidewall spacer along a lateral side of the first sidewall spacer;
    performing a deep source/drain implant to implant dopants into a source/drain region of the semiconductor body after forming the second sidewall spacer;
    removing at least a portion of the second sidewall spacer after the deep source/drain implant; and forming a stress inducing layer over the gate and the first sidewall spacer after removing at least a portion of the second sidewall spacer.

2. The method of claim 1:

wherein forming the first sidewall spacer comprises:

forming a first sidewall spacer material over the gate structure and over the source/drain region of the semiconductor body, and performing a first anisoptropic etch process to selectively remove the first sidewall spacer material from over the gate structure and from an outer portion of the source/drain region, leaving the first sidewall spacer along the lateral side of the gate structure over a portion of the source/drain region; and wherein forming the second sidewall spacer comprises:

forming a second sidewall spacer material over the gate structure, over the first sidewall spacer, and over the outer portion of the source/drain region, and performing a second anisotropic etch process to selectively remove the second sidewall spacer material from over the gate structure and from part of the outer portion of the source/drain region, leaving the second sidewall spacer along the lateral side of the first sidewall spacer.

3. The method of claim 2, wherein the first and second sidewall spacer materials are different.

4. The method of claim 3, wherein removing at least a portion of the second sidewall spacer comprises performing a third etch process to remove at least a portion of the second sidewall spacer material after the deep source/drain implant, the third etch process being selective to the first sidewall spacer material.

5. The method of claim 2, wherein forming the first sidewall spacer comprises depositing $Si_WC_XN_Y$ or $Si_WC_XN_YO_Z$ using a BTBAS precursor, and wherein forming the second sidewall spacer material comprises depositing silicon nitride with substantially no carbon.

6. The method of claim 5, wherein removing at least a portion of the second sidewall spacer comprises performing a third etch process to remove at least a portion of the second sidewall spacer material after the deep source/drain implant, the third etch process being selective to the first sidewall spacer material.

7. The method of claim 5, wherein removing at least a portion of the second sidewall spacer comprises wet etching the second sidewall spacer material using phosphoric acid at a temperature of about 160 degrees C. after the deep source/drain implant.

8. The method of claim 5, wherein removing at least a portion of the second sidewall spacer comprises reducing a lateral width of the second sidewall spacer by about 100 Å or more after the deep source/drain implant.

9. The method of claim 1, wherein the first and second sidewall spacers are of different materials.

10. The method of claim 1, wherein removing at least a portion of the second sidewall spacer comprises performing an etch process to remove at least a portion of the second sidewall spacer material after the deep source/drain implant, the etch process being selective to the first sidewall spacer.

11. The method of claim 1, wherein the first sidewall spacer comprises $Si_WC_XN_Y$ or $Si_WC_XN_YO_Z$, and wherein the second sidewall spacer comprises silicon nitride with substantially no carbon.

12. The method of claim 11, wherein removing at least a portion of the second sidewall spacer comprises wet etching the second sidewall spacer material using phosphoric acid at a temperature of about 160 degrees C. after the deep source/drain implant.

13. The method of claim 11, wherein removing at least a portion of the second sidewall spacer comprises reducing a lateral width of the second sidewall spacer by about 100 Å or more after the deep source/drain implant.

14. The method of claim 1, wherein a subsequent application of thermal energy to said stress inducing layer during processing further increases the tensile stress in a predetermined region of said transistor.

15. A method of fabricating a transistor, the method comprising:

forming first and second sidewall spacers laterally outward from a gate structure, the first sidewall spacer extending between a lateral side of the gate structure and the second sidewall spacer;

implanting a source/drain region of a semiconductor body after forming the first and second sidewall spacers; and removing substantially all of the second sidewall spacer after implanting the source/drain region; and forming a stress inducing layer over the gate and the first sidewall spacer after removing substantially all of the second sidewall spacer.

16. The method of claim 15, wherein the first and second sidewall spacers are of different materials.

17. The method of claim 16, wherein removing substantially all of the second sidewall spacer comprises performing an etch process to remove substantially all of the second sidewall spacer material after the deep source/drain implant, the etch process being selective to the first sidewall spacer.

18. The method of claim 15, wherein removing substantially all of the second sidewall spacer comprises reducing a lateral width of the second sidewall spacer by about 100 Å or more after the deep source/drain implant.

19. The method of claim 15, wherein forming the first sidewall spacer comprises:

forming a first sidewall spacer material over the gate structure and over the source/drain region of the semiconductor body, and selectively removing the first sidewall spacer material from over the gate structure and from an outer portion of the source/drain region, leaving the first sidewall spacer along the lateral side of the gate structure over a portion of the source/drain region; and wherein forming the second sidewall spacer comprises:

forming a second sidewall spacer material over the gate structure, over the first sidewall spacer, and over the outer portion of the source/drain region, and selectively removing the second sidewall spacer material from over the gate structure and from part of the outer portion of the source/drain region, leaving the second sidewall spacer along the lateral side of the first sidewall spacer.

20. The method of claim 15, wherein a subsequent application of thermal energy to said stress inducing layer during processing further increases the tensile stress in a predetermined region of said transistor.

21. A method of fabricating a transistor, the method comprising:

forming a gate structure over a channel region of a semiconductor body;

forming a first sidewall spacer along a lateral side of the gate structure, said forming including depositing $Si_WC_XN_Y$ or $Si_WC_XN_YO_Z$ using a BTBAS precursor;

forming a second sidewall spacer along a lateral side of the first sidewall spacer, said forming a second sidewall spacer including depositing silicon nitride with substantially no carbon;

performing a deep source/drain implant to implant dopants into a source/drain region of the semiconductor body after forming the second sidewall spacer;

removing at least a portion of the second sidewall spacer after the deep source/drain implant; and forming a stress inducing layer over the gate and the first sidewall spacer after removing at least a portion of the second sidewall spacer.

* * * * *